(12) United States Patent
Alzaher et al.

(10) Patent No.: US 8,436,679 B1
(45) Date of Patent: May 7, 2013

(54) LOW FREQUENCY NOTCH FILTER INTEGRATED CIRCUIT

(75) Inventors: Hussain Alzaher, Dhahran (SA); Noman Ali Tasadduq, Dhahran (SA)

(73) Assignees: King Fahd University of Petroleum and Minerals, Dhahran (SA); King Abdulaziz City for Science and Technology, Riyadh (SA)

( * ) Notice: Subject to any disclaimer, the term of this patent is extended or adjusted under 35 U.S.C. 154(b) by 0 days.

(21) Appl. No.: 13/372,307

(22) Filed: Feb. 13, 2012

(51) Int. Cl.
*H03B 1/00* (2006.01)

(52) U.S. Cl.
USPC ............................................................ 327/556

(58) Field of Classification Search .................. None
See application file for complete search history.

(56) References Cited

U.S. PATENT DOCUMENTS

| | | | |
|---|---|---|---|
| 7,239,196 B2 | 7/2007 | Hasegawa | |
| 8,031,094 B2* | 10/2011 | Hotelling et al. | 341/143 |
| 8,120,417 B2* | 2/2012 | Kannan et al. | 327/552 |

OTHER PUBLICATIONS

*An integrable 60-Hz notch filter*, Casper, B.K. et al., Circuits and Systems II: IEEE Transactions on Analog and Digital Signal Processing, Jan. 1999, vol. 46 Issue 1, pp. 74-77.

* cited by examiner

*Primary Examiner* — Lincoln Donovan
*Assistant Examiner* — Sibin Chen
(74) *Attorney, Agent, or Firm* — Richard C. Litman (57) ABSTRACT

The low frequency notch filter integrated circuit is implemented in a relatively small silicon area and with high linearity, thereby promoting the utilization of very large-scale integration (VLSI) techniques in biomedical instrumentation. The filter circuit utilizes R-2R ladders providing area saving of approximately 120:1. R-2R ladders function as digitally programmable resistors in a biquad configured Operational Amplifier filter circuit. Integrator loop topologies are used in the filter circuit. The preferred topology utilizes a Tow-Thomas circuit, which can be designed for the prerequisite gain and Q independently selecting two resistors. In addition, the three op amps in the Tow-Thomas topology have their non-inverting input grounded, and therefore their inverting inputs will be held ideally at virtual ground. These feature permits the use of op amps with small common mode input range.

8 Claims, 4 Drawing Sheets

LOW FREQUENCY NOTCH FILTER INTEGRATED CIRCUIT

BACKGROUND OF THE INVENTION

1. Field of the Invention

The present invention relates to notch filters, and particularly to a low frequency notch filter integrated circuit having digitally controlled resistor ladders.

2. Description of the Related Art

Very low frequency filters have a wide range of applications in biomedical signal processing, and in audio and neural networks. In instrumentation systems, it is usually desired to eliminate power line frequency disturbance of 60 Hz (50 Hz in Europe) from the measured signal using notch filters. Examples include biomedical engineering, automatic control, and communications over public utility systems. In particular, power line interference is the most common problem in the detection and processing of biopotential signals. Despite the use of differential amplification methods and active body potential driving to eliminate the common-mode signals, line frequency interference occurs in the important frequency range where biopotentials and other physiological signals have most of their energy. This is the case in electroencephalogram (EEG), electrocardiogram (ECG), and electromyelogram (EMG) recordings.

Power line interference has considerable effect and plays an important part on the quality of these signals. Many notch filter circuits are designed to eliminate this unwanted noise. In order to utilize very large-scale integration (VLSI) techniques in biomedical instrumentation, implementation of a 60 Hz notch filter in a single integrated chip (IC) is desired. This has been a challenging design problem due to the difficulty in developing efficient methods to achieve a large time constant using integrated passive elements. Such a notch filter would require resistances in the order of megaohms and capacitances in the range of nanofarads, and therefore is impractical for implementation on an integrated circuit (IC) chip. The available silicon area on an IC chip limits the sizes of resistors and capacitors. Typical values for on-chip integrated circuit resistors are from 1Ω to 40 kΩ, and for capacitors, from 0.5 pF to 50 pF. Components with much larger values would suffer from nonlinearities and parasitics that may prevent proper circuit operation.

Thus, a low frequency notch filter integrated circuit solving the aforementioned problems is desired.

SUMMARY OF THE INVENTION

The low frequency notch filter integrated circuit is implemented in a relatively small silicon area and with high linearity, thereby promoting the utilization of very large-scale integration (VLSI) techniques in biomedical instrumentation. The filter circuit utilizes R-2R ladders, providing an area saving of approximately 120:1. R-2R ladders function as digitally programmable resistors in a biquad-configured operational amplifier filter circuit. Integrator loop topologies are used in the filter circuit. The preferred topology utilizes a Tow-Thomas circuit, which can be designed for the prerequisite gain and Q, independently selecting two resistors. In addition, the three op amps in the Tow-Thomas topology have their non-inverting input grounded, and therefore their inverting inputs will be held ideally at virtual ground. These features permit the use of op amps with small common mode input range.

These and other features of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

Figure 1:
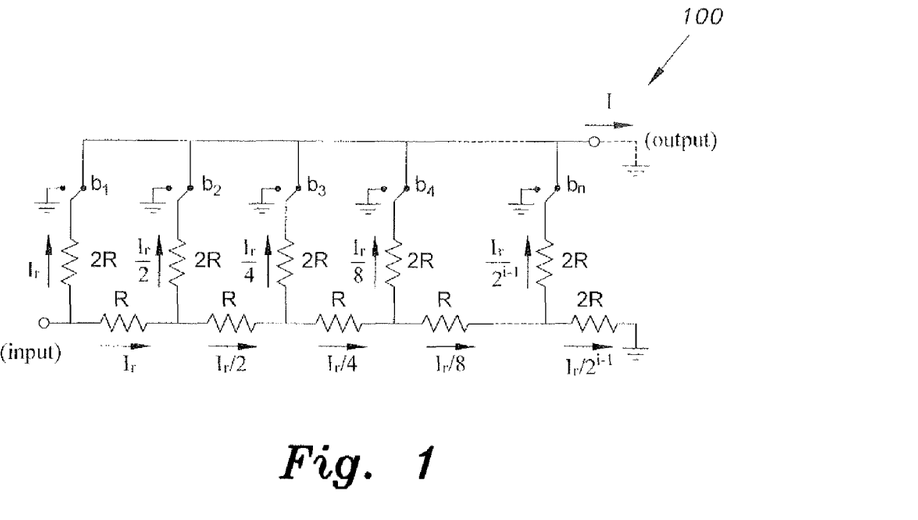
FIG. 1 is a schematic diagram of an exemplary R-2R ladder circuit.
Figure 2:
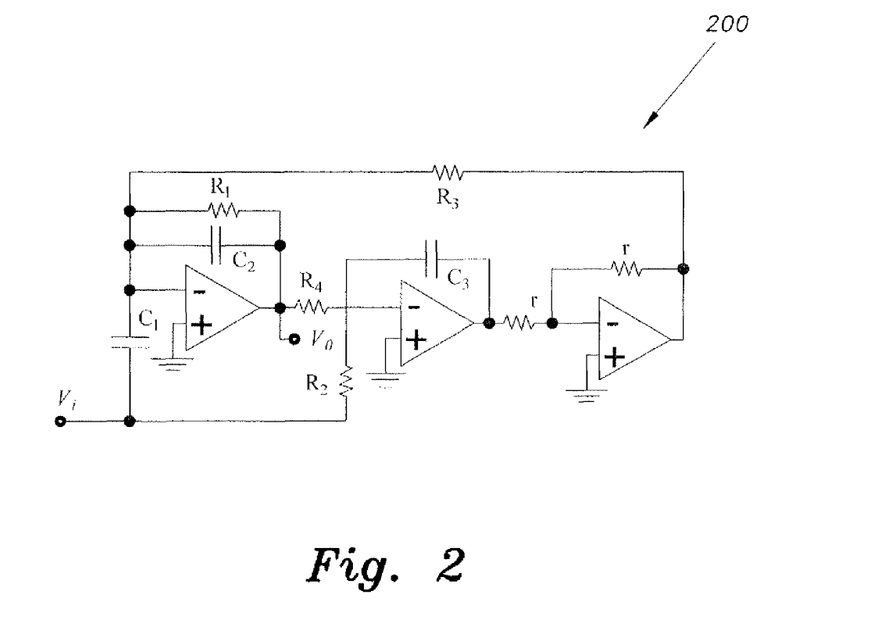
FIG. 2 is a schematic diagram of an exemplary notch topology circuit based on a Tow-Thomas biquad filter circuit.

The low frequency notch filter integrated circuit is implemented in a relatively small silicon area and with high linearity, thereby promoting the utilization of very large-scale integration (VLSI) techniques in biomedical instrumentation. The filter circuit utilizes R-2R ladders, providing an area saving of approximately 120:1. An exemplary R-2R ladder circuit 100 is shown in FIG. 1. R-2R ladders function as digitally programmable resistors in a biquad configured Operational Amplifier (op amp) filter circuit. Integrator loop topologies are used in the filter circuit. The preferred topology utilizes a Tow-Thomas circuit, which can be designed for the prerequisite gain and Q independently selecting two resistors. An exemplary Tow-Thomas circuit 200 is shown in FIG. 2. In addition, the three op amps in the Tow-Thomas topology have their non-inverting input (denoted by the "+" sign in the drawings) grounded, and therefore their inverting inputs (designated by the "−" sign in the drawings) will be held ideally at virtual ground. These features permit the use of op amps with small common mode input range.

The general form of a second order notch filter transfer function is given by:

$$T(s) = K \frac{s^2 + \omega_o^2}{s^2 + \frac{\omega_o}{Q}s + \omega_o^2} \quad (1)$$

where $\omega_0$ is pole frequency, as well as the notch frequency (zeroes at $\pm j\omega_0$), Q is the pole quality factor, and K is the gain. The selectivity performance of a notch filter is characterized by its notch depth, ideally infinity, and Q. For active notch filters, linearity, power consumption, and area (practically for low frequency applications) are required to be optimized. The linearity of the filter must be as high as possible so that it does not degrade the performance of the overall system. Programmability is also needed to adjust the filter zero frequency to its nominal value, compensating for inaccurate component values, process variations, and temperature changes.

SC filters are suitable candidates for implementing the low frequency filters. However, they are associated with switching noise, limiting their application. On the other hand, continuous time CMOS $g_m$-C filters, which can operate at low frequencies, are incapable of providing good linearity. Active-RC filters based on op amps provide linearity, but traditionally cannot implement a large time constant. Table I provides general comparisons between the different techniques regarding their operational compatibility.

Based on Table I, the solution to this problem is to use active-RC filters based on op amps. Active-RC filters can achieve high linearity and they are free of switching noise. Therefore, the proposed solution must adopt this approach, but by incorporating some techniques allowing both the realization of a 60 Hz notch frequency and the programmability feature. The low frequency notch filter integrated circuit uses R-2R ladders, which are usually used in data converters, to allow the realization of large time constants. The R-2R ladder 100 shown in FIG. 1 can be considered as a digitally programmable resistor. It can be shown that the output current (I) is given by:

$$I = \sum_{i=1}^{n} \frac{b_i I_r}{2^{i-1}} \text{ where } I_r = \frac{V}{2R} \quad (2)$$

TABLE I

Performance Comparison

| Feature | $g_m$-C | SC | Active-RC | Active-RC with TCM | Present Filter |
|---|---|---|---|---|---|
| Power | Low | Low | Low | High | Low |
| Linearity | Low | High | High | High | High |
| Area | Small | Small | Not possible | Not given | Small |
| Switching noise | No | Yes | No | No | No |
| Programmability | Yes | Yes | No | No | Yes |

Therefore, the equivalent resistance, seen between the input and output nodes, is given by:

$$R_{eq} = \frac{V}{I} = \beta R \text{ where } \beta = \frac{1}{\sum_{i=1}^{n} b_i 2^{-i}} \quad (3)$$

where $b_i$, being the $i^{th}$ bit in an n-bit digital control word, takes on the values of 0 or 1. It can be observed that a large R-2R ladder equivalent resistance can be achieved using a relatively small passive resistance. For example, for a 10-bit R-2R ladder with R=10 kΩ, equivalent resistance as high as 10 MΩ can be achieved while requiring an actual silicon area for a resistance of only 300 kΩ.

Figure 3:
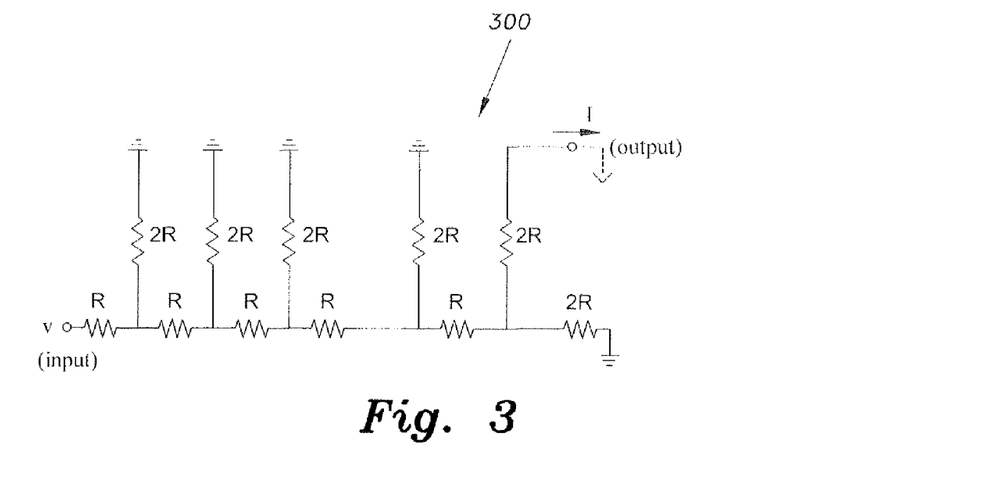
FIG. 3 is a schematic diagram of an exemplary R-2R ladder circuit configuration for use in a low frequency notch filter integrated circuit according to the present invention.

The R-2R ladder 300 can be incorporated into the circuit design to provide large resistance values. This is achieved by replacing the passive resistors R1, R2, R3, and R4 (shown in FIG. 2) controlling the filter parameters of the original filter by R-2R ladders 300 to obtain the active Tow-Thomas circuit 400 shown in FIG. 4. This can be applied as long as these resistors are connected to virtual ground, which simulates the proper operating condition of the R-2R ladder 300.

Biquads based on a single-op amp are more power efficient than their multi-op amp-based counterparts. However, such minimal op amp realizations require passive component matching conditions to realize a notch response. Without this constraint, the filter would exhibit different transfer functions. In particular, the depth of the notch will be significantly reduced for inaccurate component values. Examples include the general biquads based on the Sallen-Key and Delyiannis-Friend filters. The second important factor that prevents the use of such topologies for this application is the absence of the virtual grounds required to include R-2R ladders in the filter design.

In fact, the requisite virtual grounds are available in multi-op amp biquads developed from two-integrator loop topologies, namely Kerwin-Huelsman-Newcomb (KHN) and Tow-Thomas. There are two methods to obtain the notch filter from the basic circuit of KHN and Tow-Thomas. The first approach is to sum the HPF (high pass filter) and LPF (low pass filter) in KHN, or the input signal and the BPF (bandpass filter) in Tow-Thomas. In this case, an additional op amp and three resistors would be required by the adder circuit. It can be shown that, unlike a KHN filter, the Tow-Thomas can be designed for the prerequisite gain and Q independently selecting two resistors. Then, the pole frequency can be independently adjusted by tuning all resistors simultaneously.

Figure 4:
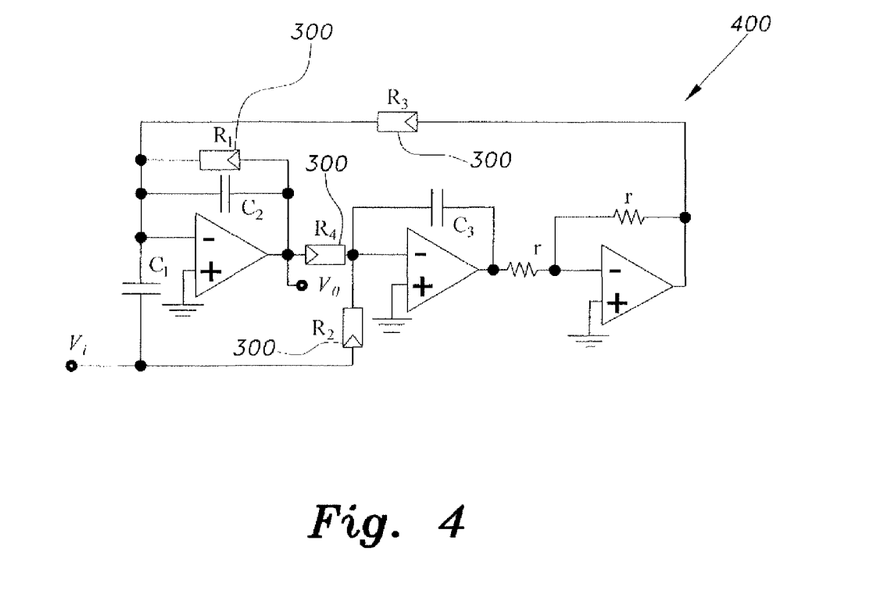
FIG. 4 is a schematic diagram of an exemplary notch filter circuit for use in a low frequency notch filter integrated circuit according to the present invention, the notch filter using the R-2R configuration of FIG. 3 for resistors R1-R4.

The second technique is more efficient, requiring no additional op amp, but only injecting the input signal into the proper internal nodes to produce the required notch function. The notch filter based on the Tow-Thomas biquad and feedforward technique shown in FIG. 2 is selected for this application. It requires an additional capacitor, $C_1$, to realize the notch function (thus configuring the first op amp in FIG. 4 as a lossy integrator), compared with the basic Tow-Thomas biquad. The second operational amplifier in FIG. 4 is configured as an inverting integrator, and the third operational amplifier being configured as an inverting amplifier Assuming the op amps to be ideal, routine analysis shows that the filter exhibits the following transfer function:

$$\frac{V_o}{V_i} = -\frac{s^2\left(\frac{C_1}{C_2}\right) + \frac{1}{C_2 C_3 R_3 R_4}}{s^2 + s\left(\frac{1}{C_2 R_1}\right) + \left(\frac{1}{C_2 C_3 R_3 R_4}\right)} \quad (4)$$

For equal gain of unity in LF (low frequency) and HF (high frequency) sides of the notch, the conditions $R_2=R_4=R$ and $C_1=C_2=C$ are required. Selecting $R_1=qR$ and $R_3=R$, as in the basic topology, the pole (the notch) frequency and pole Q factor are given by:

$$\omega_o^2 = \frac{1}{CC_3 R^2} \quad (5)$$

$$Q = \sqrt{\frac{C}{C_3}} q \quad (6)$$

Therefore, the notch frequency can be adjusted without disturbing Q by adjusting either all capacitors or all resistors simultaneously.

The optimum use of R-2R ladders 300 in this application occurs when their configurations result in the largest possible equivalent resistance. It can be seen from equation (2) that the maximum equivalent resistance of an R-2R ladder is achieved when only the least significant branch current ($I_{LS}$) is connected to the virtual ground (i.e., $b_n=1$, and for all other branches i, $b_i=0$). Therefore, the maximum resistance, $R_{eq(max)}=2^n R$, can be increased by increasing the size of the ladder (n) and/or the value of the basic resistance R. In this case, there is no need to use any switch, thereby saving a huge silicon area. Also, since the value of $I_{LS}$ is independent of the 2R resistance connected with the most significant bit, it can be removed to save some more area. Thus, the total area needed to make an n-bit R-2R ladder reduces to that of $R_{tot}=(3n-1)R$. The relative saving in area achieved through the use of R-2R ladder 300 is proportional to $R_{eq(max)}/R_{tot}=2^n/(3n-1)$. Therefore, it can be seen that this saving is independent of R values and it improves considerably as increases. Saving in area of approximately 11, 35, 117 and 400 times is achieved for n=8, 10, 12, and 14, respectively. The low frequency notch filter integrated circuit 400 is shown in FIG. 4, wherein each resistor symbol R1, R2, R3, R4 represents an R-2R ladder 300 implemented as shown in FIG. 3. Including the ladder in the filter design results in the following parameters:

$$\omega_o^2 = \frac{1}{CC_3 R_{eq(max)}^2} = \frac{1}{CC_3 2^{2n} R^2} \quad (7)$$

$$Q = \sqrt{\frac{C}{C_3}} q \quad (8)$$

where qR and R are the basic resistances of the ladders forming $R_1$ and $R_2$-$R_4$, respectively.

Equation (4) is obtained assuming the op amp gain to be infinity. Since the frequency of operation is low, the proposed filter will not suffer from the op amp's gain bandwidth product problem. However, adopting practical op amps with finite gains will result in deviations from the ideal response. Active-RC filters are designed based on the larger open-loop gain of op amps and closed-loop configurations. Therefore, as the open-loop gain of op amps increases, the error between the ideal and practical responses of the filter becomes less, and its linearity and noise performance will improve.

Assuming finite op amp gains of A, non-ideal analysis of the unmodified Tow-Thomas circuit 200 of FIG. 2 yields the following transfer function:

$$\frac{V_o}{V_i} = \frac{s^2\left(\frac{C_1}{C_2}\right) + s\left(\frac{C_1}{C_2 C_3 R_4 A} + \frac{C_1}{C_2 C_3 R_2 A}\right) + \frac{1}{C_2 C_3 R_2 R_3}}{s^2\left(1 + \frac{C_1}{C_2 A}\right) + sX + Y} \quad (9)$$

where $X = \left(\frac{1}{C_3 R_4 A} + \frac{1}{C_3 R_2 A} + \frac{1}{C_2 R_1} + \frac{2}{C_2 R_3 A}\right)$ and $Y = \left(\frac{1}{C_2 C_3 R_3 R_4} + \frac{1}{C_2 C_3 R_1 R_4 A} + \frac{1}{C_2 C_3 R_1 R_2 A}\right)$ It can be seen that as $A\to\infty$, equation (9) reduces to equation (4). It is clear that finite A generates an s-term in numerator (N(s)), and therefore the notch will not exhibit absolute zero at $\omega_0$. Also, it introduces errors in all coefficients in denominator (D(S)) of the transfer function that will be studied carefully. When $R_2=R_4=R$, $C_1=C_2=C$, $R_1=qR$, and $R_3=R$, equation (9) reduces to:

$$\frac{V_o}{V_i} = -\frac{s^2 + s\left(\frac{2}{C_3 RA}\right) + \frac{1}{CC_3 R^2}}{s^2\left(1 + \frac{1}{A}\right) + s\left(\frac{2}{C_3 RA} + \frac{1}{CqR} + \frac{2}{CRA}\right) + \left(\frac{1}{CC_3 R^2} + \frac{2}{CC_3 qR^2 A}\right)} \quad (10)$$

Note that $C_3$ is not selected to be equal to C when it is observed that its value is important for optimizing the response of the filter. It can be seen that some of the error terms can be neglected safely. For example, the conditions A>>1 and $CC_3 R^2 << CC_3 qR^2 A/2$ require A>>max $\{1, 2/q\}$, which is naturally satisfied in practice, reducing equation (10) to:

$$T_{(non-ideal)}(s) = \frac{V_o}{V_i} \approx \frac{s^2 + s\left(\frac{2}{C_3 RA}\right) + \frac{1}{CC_3 R^2}}{s^2\left(1 + \frac{1}{A}\right) + s\left(\frac{2}{C_3 RA} + \frac{1}{CqR} + \frac{2}{CRA}\right) + \left(\frac{1}{CC_3 R^2} + \frac{2}{CC_3 qR^2 A}\right)} \quad (11)$$

The non-ideal parameters of the filter will be approximately given by:

$$\omega_{o(non-ideal)}^2 = \omega_o^2 = \frac{1}{CC_3 R^2} \quad (12)$$

$$\frac{\omega_{o(non-deal)}}{Q_{(non-ideal)}} = \frac{2}{C_3 RA} + \frac{1}{CqR} + \frac{2}{CRA} \quad (13)$$

$$\Rightarrow Q_{(non-ideal)} = \quad (14)$$

$$\frac{1}{\frac{1}{CqR} + \frac{2}{A}\left(\frac{1}{C_3} + \frac{1}{C}\right)} \times \frac{1}{R\sqrt{CC_3}} = Q\frac{1}{1 + \frac{2q}{A}\left(\frac{C}{C_3} + 1\right)}$$

The magnitude of the transfer function at the notch frequency will become:

$$|T_{(non-ideal)}(j\omega_o)| = \frac{\frac{2}{C_3 RA}}{\frac{2}{C_3 RA} + \frac{1}{CqR} + \frac{2}{CRA}} \quad (15)$$

With unity gain response, the depth of the notch will be given by:

$$p = \frac{1}{|T_{(non-ideal)}(j\omega_o)|} = 1 + \frac{C_3}{C}\left(\frac{A}{2q} + 1\right) = 1 + \sqrt{\frac{C_3}{C}\left(\frac{A}{Q} + \sqrt{\frac{C_3}{C}}\right)} \quad (16)$$

Therefore, p can be increased by increasing the $C_3/C$ ratio, A and/or decreasing Q. The value of any non-ideal notch response at notch frequency will be approximately the ratio of coefficients of s-terms in the N(s) and D(s). The s-terms in the N(s) must be a function of (1/A), while that of D(s) must be sum of a function of (1/A) and $\omega_0/Q$, since as A goes to infinity, these terms must reduce to zero and $\omega_0/Q$, respectively. Therefore, it can be concluded that in practice, and for any notch filter, there is an inverse relationship between the depth of the notch p and Q. On the other hand, it is clear from equation (16) that as A increases, p will increase and $Q_{(non-ideal)}$ will slightly increase to approach its ideal value. Also, increasing the ratio $C_3/C$ will have more impact on increasing p than decreasing Q. Hence, it is advantageous to select $C_3/C$ as large as possible. In practice, however, the gain A of an op amp can be increased by increasing the biasing current. Therefore, the depth of the notch and Q can be improved, but at the expense of higher power consumption for a given op amp and value of $C_3/C$.

The effect of the mismatch of the components onto the notch depth is also studied. The mismatch in the passive components is described by $\Delta R = R_2 - R_4$ and $\Delta C = C_1 - C_2$ where R and C are the averages of the two ideally matched passive components. These relations can be used with equation (4) to give:

$$p = \frac{1}{\sqrt{\left(1+\frac{\Delta R}{2R}\right)^2\left(\frac{\Delta R}{2R}+\frac{\Delta C}{2C}-\frac{\Delta R \Delta C}{2R2C}\right)^2 + \frac{1}{Q^2}\frac{\left(1+\frac{\Delta R}{2R}\right)^2}{\left(\frac{\Delta R}{2R}+\frac{\Delta C}{2C}+\frac{\Delta R \Delta C}{2R2C}\right)^2}}} \quad (17)$$

It can be shown that equation (17) can be approximated as:

$$p \approx \frac{1}{Q}\frac{\left(1+\frac{\Delta R}{2R}\right)}{\left|\frac{\Delta R}{2R}+\frac{\Delta C}{2C}\right|} \quad (18)$$

Note that $\Delta R$ and $\Delta C$ can be positive or negative. Assuming a passive components mismatch of 1%, which is typically observed for small-area diffused devices, this would lead to a notch depth of 46 dB, whereas mismatches of 0.5% would result in a notch depth of 52 dB. As matching accuracy is improved using large devices and careful layout, the notch attenuation increases. For example, a 0.1% matching accuracy would improve the notch depth to 86 dB.

Figure 5:
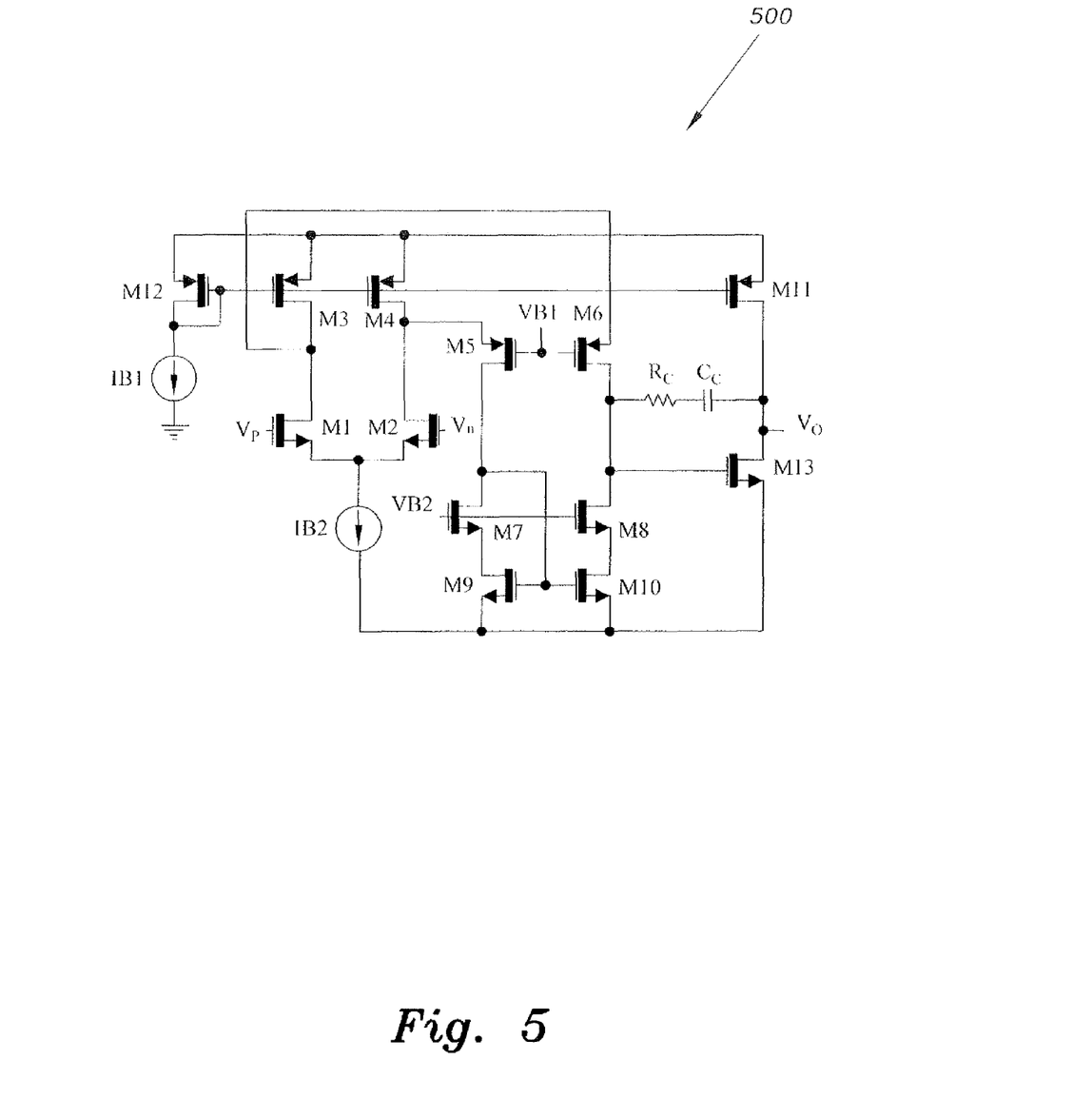
FIG. 5 is a schematic diagram of an exemplary op amp circuit used for the operational amplifiers of the circuit of FIG. 4.

Among various op amp circuits, a folded-cascode op amp, as shown in the exemplary op amp circuit 500 in FIG. 5, exhibits high DC gain and bandwidth. The DC gain is crucial in deciding the accuracy of the filter, particularly the notch depth, whereas unity gain frequency of the op amp limits the high frequency operating range. This sets a limit on the highest frequency before roll off in the frequency response of filter. These objectives are achieved using a single-stage op amp having a single high impedance node at the output of the op amp. All other internal impedances are kept low to maximize the op amp speed. However, such an op amp is suitable to drive capacitive loads. If resistive loads are used, it is necessary for the op amp to exhibit low output impedance.

Therefore, a second gain stage can be added to achieve low output impedance when the op amp is used in negative feedback configurations, as shown in the circuit 500 in FIG. 5. It can be shown that without the second stage, the closed-loop output resistance would be approximately $1/g_m$. On the other hand, with the second gain stage, the output resistance becomes very small and is of the order of $1/(g_m^3 r_0^2)$, enabling the op amp to drive resistive loads.

Different characteristics of the op amp circuit 500 were found using SPICE simulation. TSCM 0.35 µm CMOS models available through MOSIS were used. Supply voltages were $V_{DD}=V_{SS}=1.5$V, and the total current was 200 µA. Gain of 96 dB is achieved with the worst resistive load driven by the op amps in the Tow-Thomas filter circuit 400 of FIG. 4 (i.e., resistors of the inverter r=10 kΩ). Moreover, the resistive loads of the other op amps of the circuit 400 are ladders exhibiting equivalent resistances in the MΩ range. The op amp compensation network was optimized with a capacitive load of 50 pF (which represents the maximum load capacitance derived by the middle op amp) along with a 10 kΩ resistor to achieve a phase margin of 48° with $f_t$ of 22 MHz.

The value of CR required to achieve a 60 Hz notch frequency can be determined for a specific ladder size and $C_3$. Assuming maximum capacitance of 50 pF for $C_3$ and R-40 kΩ, Table II gives the required value of $C=C_1=C_2$ for several ladder sizes. Also, the value of qR is given to maintain $Q=\frac{1}{2}$ for different cases.

TABLE II

Passive component values for various ladder sizes

| bits | C = $C_1$ = $C_2$ | qR |
|---|---|---|
| 14 | 0.325 pF | 248 kΩ |
| 13 | 1.3 pF | 124 kΩ |
| 12 | 5.2 pF | 62 kΩ |
| 11 | 20.5 pF | 31 kΩ |
| 10 | 84 pF | 15.5 kΩ |

Table II shows that ladder sizes must be more than 10 bits to have reasonable values of C. For n=11 bits, the ratio $C_3/C=50/20$ is relatively small, and hence will limit the notch depth. This is confirmed by the simulation results, where a notch depth of only 42.5 dB is achieved. Considering the passive components for the cases of 13 bits and 14 bits, it can be seen that the former choice is more area efficient. This is clear, since this case requires additional capacitance of just 2 pF for C, while it requires half of the area for the ladder forming $R_1$ and uses one bit less for the ladders making $R_2$ through $R_4$.

Comparing the cases of ladder size of 12 bits with that of 13 bits, it is expected that the latter case will provide better notch depth. Simulation results show a notch depth of exactly 49.74 dB for the case of 13-bit ladders. However, the former case is more area efficient, as the additional 10 pF in C value is less than the area of adding 1 bit for four ladders and double the area for the ladder forming qR. Thus, it can be concluded that the optimum design is achieved for the case of 12 bits, wherein the passive components are $C_3=50$ pF, C1=C2=5.2 pF, R=40 kΩ, and qR=62 kΩ. In addition, the frequency response of the 12-bit ladder design shows a notch depth of 49.67 dB, which is less than the case of 13 bits by just 0.07 dB. Also, it was found that the gain of the high passband filter is flat for frequencies up to approximately 10 MHz, which makes it suitable for high frequency applications because of the high unity gain frequency of the op amps.

In conventional use of R-2R ladders in data conversion, the main error sources are due to mismatches of the switch on-resistances, which are avoided in the present circuit. Mismatches of passive resistance within each ladder will cause an error in the value of $R_{eq}$. This would cause the notch frequency to deviate from its nominal value due to variation in the $R_{eq}C$ product.

It can be seen from equations (7) and (8) that $\omega_0$ can be tuned without disturbing Q via adjusting either all resistors and/or all capacitors simultaneously. The R-2R ladders can be programmed to tune the notch frequency over a wide range (e.g., by an external microprocessor sending control signals to transistor switches on the integrated circuit to control the number of bits in the R-2R ladders), providing the opportunity to accommodate different possible applications. For instance, with 10-bit ladders, a frequency tuning range of more than 3 decades can be achieved. However, this technique would be unsuitable for fine tuning, since every bit change would double the notch frequency.

Fine tuning can be achieved using resistors and/or capacitor matrices with small areas. The conventional use of such matrices exhibits large areas, as they are intended to coarse tune in addition to fine tune. Coarse tuning requires a large component spread. Simultaneous tuning of all resistors would require 4 resistors arrays, while tuning capacitors only require 3 capacitor arrays. Therefore, three capacitor matrices are adopted to tune the filter notch frequency Thus, in FIG. 4, $C_1$, $C_2$, and $C_3$ each may represent capacitor a plurality of selectable capacitors forming a capacitor matrix. A tuning range from 40 Hz to 80 Hz for the notch frequency is selected. This allows for compensating for ±33.3% variation in nominal frequency. To achieve resolution accuracy of approximately 1% (0.6 Hz), capacitor matrices of 6 bits are incorporated.

Unlike the high-frequency (noise generating) switches of the SC technique, the switches of the capacitor arrays are quasi-static (e.g., transistor switches on the integrated circuit controlled by an external microprocessor to select a desired capacitance from each of the capacitor matrices), which is suitable for sensitive analog signal processing. The embedded digital tuning feature of the proposed approach allows direct programmability by digital tuning. A known digital automatic frequency tuning scheme can be employed to compensate for both component and temperature variations.

The theoretical studies investigating the effects of op amp gains and passive component values on the frequency response and various filter parameters are also confirmed by simulation results. Frequency responses for different op amp gains show that as A is increased, the notch depth increases with very little improvement of Q values. Notch depths of 72 dB, 65 dB, 55 dB, and 48 dB can be achieved for op amps with gains of 130 dB, 120 dB, 110 dB, and 100 dB, respectively. The effects of varying Q on the depth of the notch are investigated. It has been found that the depth reduces from 55 dB to 35 dB as Q is increased from ¼ to 3. Table III shows the several different values of $C_3$ and C for achieving a notch frequency of 60 Hz when using 12-bit ladders of R=40 kΩ. Also, it gives the required values of qR to adjust Q to ½. The effect of increasing $C_3$ to improve the notch depth for a fixed Q of ½ is verified. It has been found that as $C_3$ is increased, more depth is attained. In fact selecting $C_3$=50 pF (assuming a maximum capacitance of 50 pF) shows a 10 dB improvement in the notch depth compared with the case of equal capacitors.

TABLE III

Values of $C_3$ for Q = 1/2 and R = 40 kΩ

| $C_3$ | C = $C_1$ = $C_2$ | qR |
|---|---|---|
| 50 pF | 5.2 pF | 62 kΩ |
| 40 pF | 6.5 pF | 49.6 kΩ |
| 30 pF | 8.7 pF | 37.2 kΩ |
| 20 pF | 13 pF | 24.8 kΩ |
| 16.1 pF | 16.1 pF | 20 kΩ |

Table IV gives the specific resistances, minimum length and minimum spacing for different resistance layers for TSMC 0.35 μm CMOS process. Also, it provides the estimated area for implementing a 1 MΩ resistance. It can be seen that poly-2 and N-well offers about 26% and 85% saving in area, respectively, compared with their poly-1 counterpart. N-well layers are suitable for fabricating resistors with considerably high value. These resistors, however, suffer from noisy interaction with the substrate and insulation between parts of the same resistor. Hence, this method is unsuitable for this application. The specific capacitance for TSMC 0.35 μm CMOS process is 0.9191 fF/μm2. It means that a 1 pF capacitance can be made with a 33 μm×33 μm square plate.

TABLE IV

Specific resistance for different layers

| Resistors Types\ Parameters | Specific Resistance ($R_q$) | Minimum L (μm) | Minimum Spacing (μm) | Estimated area of a 1MΩ resistance (μm²) |
|---|---|---|---|---|
| Poly-1 | 7.6 | 0.35 | 0.45 | 36841 (zigzag) |
| Poly-2 | 47.3 | 0.8 | 0.8 | 27060 (zigzag) |
| n-well | 1020 | 1.7 | 1.7 | 5666 (zigzag) |

Figure 6:
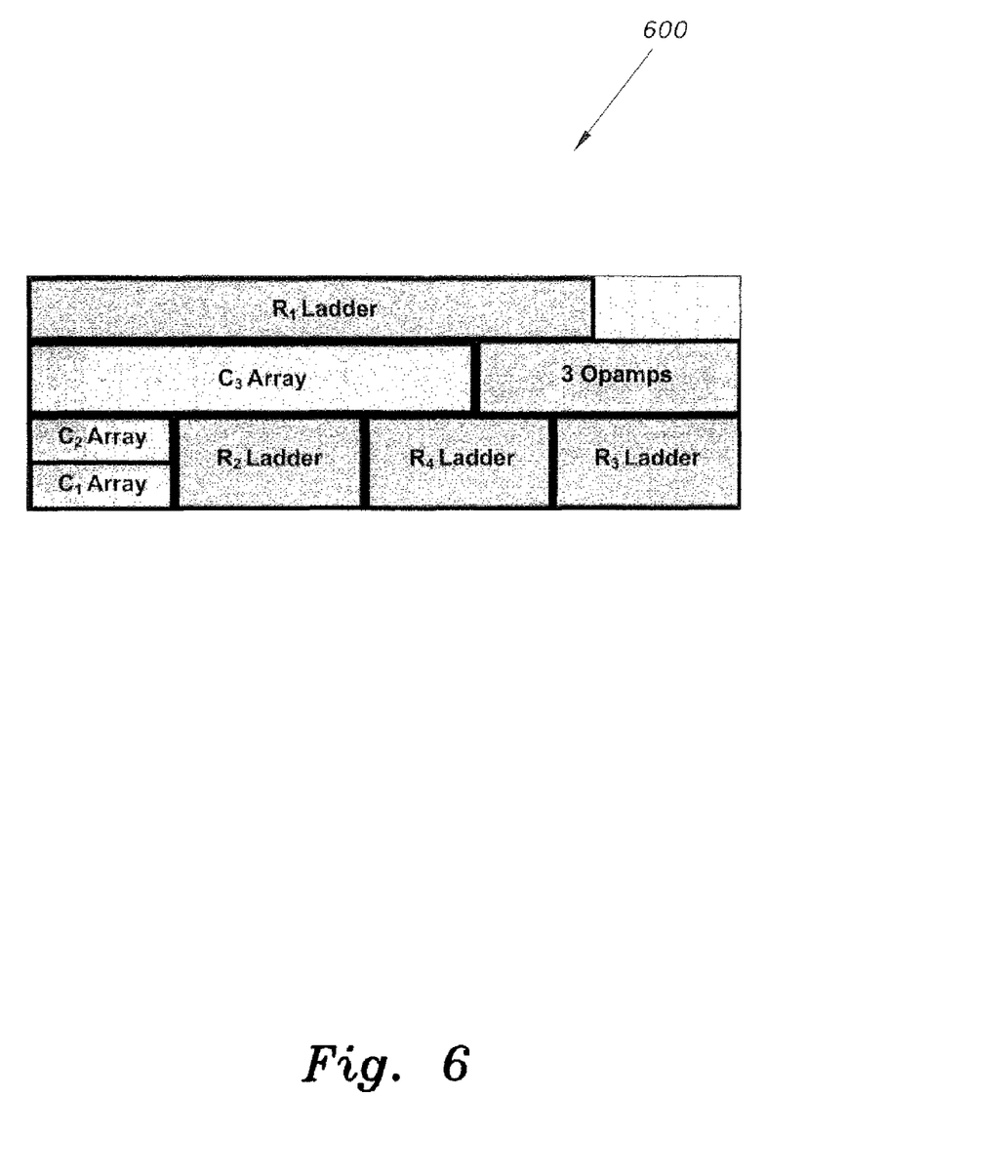
FIG. 6 is a die layout showing the relative component locations in a low frequency notch filter integrated circuit according to the present invention.

Table V gives the area occupied by each element of the proposed filter as well as the total area. A die block diagram 600 of the filter 400 occupying an area of 0.51 mm² is shown in FIG. 6.

TABLE V

Areas of various filter components

| Component | Area (mm²) |
|---|---|
| Op amps | 3 × 0.0127 = 0.038 |
| 12 bit R-2R Ladders with R = 40 kΩ | 3 × 0.058 = 0.174 |
| 12 bit R-2R Ladder with qR = 62 kΩ | 0.11 |
| Capacitor arrays for 5.2 pF | 2 × 0.013 = 0.026 |
| Capacitor array for 50 pF | 0.095 |
| Filter | 0.51 |

Experimental results show that the filter 400 of FIG. 4 achieves notch attenuation of 47 dB at 59.8 Hz and a Q of approximately ½. The notch frequency can be tuned from approximately 40 Hz to 80 Hz, which represents more than ±33% with a tuning step of about 0.64 Hz. It is found that the maximum output signal amplitude before clipping is approximately 1.2V. The associated THDs for the LFB (low frequency bandpass) and HFB (high frequency bandpass) are found by applying an 8 Hz and 200 kHz signal, respectively. A THD of better than −70 dB is recorded for both cases. Table VI summaries the various characteristics of the low frequency notch filter integrated circuit 400.

TABLE VI

Characteristics of the low frequency notch filter circuit

| Feature | Low frequency notch filter integrated circuit |
|---|---|
| Filter | Notch |
| Area | 0.51 mm² |
| Supply voltage | ±1.5 V |
| Supply current | 600 μA |
| Frequency tuning range | 40 Hz to 80 Hz |
| Depth of the notch | 47 dB @ 60 Hz |
| THD | −70 dB |

The filter 400 is realized in a total area of 0.51 mm². It consumes a total current of 600 μA from ±1.5V supply voltages. R-2R ladders 300 are adopted to allow realizing a large time constant in a small area, and they are employed in a proper filter topology. The filter 400 achieves 47 dB notch attenuation at the nominal frequency. The notch attenuation can be increased by increasing the gain of the op amps and/or improving matching of the passive component values through more careful layout. The notch frequency is designed to accommodate a frequency range from 40 Hz to 80 Hz in steps of 0.6 Hz. The HF (high frequency) band of the filter extends to more than 10 MHz. Moreover, the low frequency notch filter integrated circuit 400 can be applied in a variety of circuitry requiring low frequency filtering.

It is to be understood that the present invention is not limited to the embodiments described above, but encompasses any and all embodiments within the scope of the following claims.

We claim:

1. A low frequency notch filter circuit, comprising:

first, second and third operational amplifiers connected together in a modified Tow-Thomas biquadratic filter circuit, the first operational amplifier being configured as a lossy integrator, the second operational amplifier being configured as an inverting integrator, and the third operational amplifier being configured as an inverting amplifier, each of the operational amplifiers having an inverting input, a noninverting input, and an output, the noninverting input of each of the operational amplifiers being connected to ground;

means for accepting an input signal voltage into the first operational amplifier;

a first R-2R ladder circuit connected in parallel with a first capacitor connected between the output and the inverting input of the first operational amplifier, the first R-2R ladder circuit having a first current output connected to the output of the first operational amplifier, the first R-2R ladder circuit having a first voltage input connected to the inverting input of the first operational amplifier, the output of the first operational amplifier providing a notch-filtered version of the input signal voltage forming the output of the low frequency notch filter circuit;

a second R-2R ladder circuit having a second current output portion connected to the output of the first operational amplifier, and a second voltage input portion connected to the inverting input of the second operational amplifier;

a third R-2R ladder circuit having a third voltage input portion and a third current output portion;

means for feeding the input signal voltage into the third current output portion of the third R-2R ladder circuit, the third voltage input portion of the third R-2R ladder circuit being connected to the inverting input of the second operational amplifier; and a fourth R-2R ladder circuit having a fourth current output portion connected to the output of the third operational amplifier and a fourth voltage input portion connected to the inverting input of the first operational amplifier.

2. The low frequency notch filter circuit according to claim 1, wherein said modified Tow-Thomas biquadratic filter circuit and said first, second, third, and fourth R-2R ladder circuits are made on a single integrated circuit chip.

3. The low frequency notch filter circuit according to claim 1, wherein said first, second, third, and fourth R-2R ladder circuits further comprise means for connecting the ladder circuits to obtain maximum resistance.

4. The low frequency notch filter circuit according to claim 1, wherein said first, second and third operational amplifiers are folded cascode op amps having a second gain stage output stage.

5. The low frequency notch filter circuit according to claim 1, wherein said first, second, third, and fourth R-2R ladder circuits have a size capacity of at least 10 bits.

6. The low frequency notch filter circuit according to claim 1, wherein said first, second, third, and fourth R-2R ladder circuits each have 12 bits, the low frequency notch filter being configured to filter a narrow 60 Hz stop band from a desired signal.

7. The low frequency notch filter circuit according to claim 1, wherein said modified Tow-Thomas biquadratic filter circuit comprises three capacitor matrices, each of the matrices having a plurality of programmably selectable capacitors adapted for fine tuning the stopband frequency of the notch filter.

8. The low frequency notch filter integrated circuit according to claim 7, wherein said three capacitor matrices include quasi-static switching components for selecting one of the selectable capacitors in each of the matrices.

\* \* \* \* \*